United States Patent [19]

Yamaoka et al.

[11] Patent Number: 5,053,314

[45] Date of Patent: Oct. 1, 1991

[54] POSITIVELY PHOTOSENSITIVE POLYIMIDE COMPOSITION

[75] Inventors: Tsuguo Yamaoka, Chiba; Amane Mochizuki, Osaka; Kazumasa Igarashi, Osaka; Toshihiko Omote, Osaka, all of Japan

[73] Assignee: Nitto Denko Corporation, Osaka, Japan

[21] Appl. No.: 462,243

[22] Filed: Jan. 9, 1990

[30] Foreign Application Priority Data

Jan. 9, 1989 [JP] Japan .................................. 1-2500

[51] Int. Cl.$^5$ .............................................. G03C 7/039
[52] U.S. Cl. ...................... 430/270; 430/176; 528/184; 528/185; 528/188; 528/353; 528/26
[58] Field of Search ............ 430/270, 176, 192; 528/184, 185, 188, 353, 26

[56] References Cited

U.S. PATENT DOCUMENTS

| | | | |
|---|---|---|---|
| 3,336,258 | 8/1967 | Angelo et al. | 528/26 X |
| 3,961,099 | 6/1976 | Gipstein et al. | 430/270 X |
| 4,657,832 | 4/1987 | Pfeifer | 430/270 X |
| 4,713,439 | 12/1987 | St. Clair et al. | 528/353 |

FOREIGN PATENT DOCUMENTS

0264678 1/1987 European Pat. Off. .
0300326 7/1988 European Pat. Off. .

OTHER PUBLICATIONS

Polymer, vol. 24, pp. 995-1000 (Aug. 1983), "PolyC-p-tert-butoxycarbonyloxystyrene): a Conventient Precursor to P-Hydroxystyrene Resins".

Primary Examiner—Cynthia Hamilton
Attorney, Agent, or Firm—Sughrue, Mion, Zinn, Macpeak & Seas

[57] ABSTRACT

A positively photosensitive polyimide composition is disclosed, which composition comprises polyimide having repeating unit represented by formula (I):

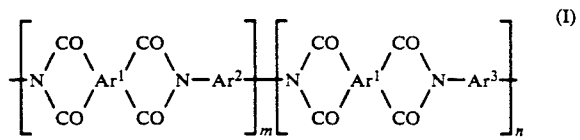

wherein $Ar^1$ represents a tetravalent aromatic hydrocarbon group; $Ar^2$ represents a divalent aromatic hydrocarbon group having an acyloxy group at the ortho-position and/or the meta-position of the aromatic ring; $Ar^3$ represents a divalent aromatic hydrocarbon group; and the subunit having an amount ratio of m in the repeating unit is present in an amount of at least 20% by weight based on the polyimide. The composition exhibits high photosensitivity in reproduction of a fine pattern and excellent dimensional stability.

3 Claims, No Drawings

POSITIVELY PHOTOSENSITIVE POLYIMIDE COMPOSITION

FIELD OF THE INVENTION

The present invention relates to a positively photosensitive polyimide composition.

BACKGROUND OF THE INVENTION

Polyimide has been widely applied to various electronic parts because of its excellent heat resistance, electrical characteristics and mechanical characteristics. For rationalization of the operation, it has hitherto been attempted to endow polyimide with photosensitivity.

Conventional proposals with respect to positively photosensitive polyimide include a method of mixing a polyimide precursor with a photosensitive orthonaphthoquinone diazide compound as disclosed in JP-A-52-13315 (the term "JP-A" as used herein means an "unexamined published Japanese patent application") and a method of mixing a soluble polyimide with a photosensitive orthonaphthoquinone diazide compound.

These known photosensitive polyimide compositions are usually coated as a solution on a support, dried, and then irradiated with actinic ray, such as ultraviolet light, through a photomask. The exposed area is then removed by dissolving with an arbitrary developer to thereby form a desired image. After image formation, the image area is subjected to a high temperature heat treatment to cyclize the polyimide precursor, followed by removal of the remaining solvent, water produced by cyclization, naphthoquinone diazide, etc. by vaporization to obtain a heat resistant polyimide film.

However, since the above-described conventional photosensitive compositions generally comprise a mixture of a polyimide precursor or polyimide and a photosensitive compound, i.e., orthonaphthoquinone diazide, exposure to light only results in solubilization of orthonaphthoquinone diazide in an alkali, while the structure of the polymer skeleton of polyimide receives no influence from light and remains unchanged.

Therefore, orthonaphthoquinone diazide must be used in a large proportion in order to assure resistance of the unexposed area against dissolution with a developer. This leads to volumetric shrinkage on curing, thus deteriorating dimensional precision.

SUMMARY OF THE INVENTION

An object of the present invention is to provide a positively photosensitive polyimide composition using a polymer having improved solubility, which exhibits high photosensitivity in image formation even of a fine pattern and has excellent dimensional precision.

Other objects of the present invention will be apparent from the following description.

As a result of extensive investigations, the inventors have found that the above objects of the present invention are accomplished by introducing a specific functional group into a molecular skeleton of an imide polymer, thus having reached the present invention.

The present invention provides a positively photosensitive polyimide composition containing polyimide having a repeating unit represented by formula (I):

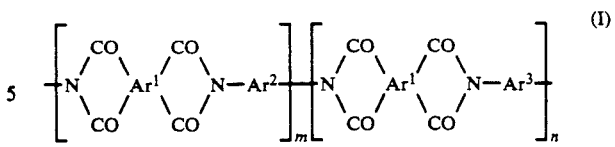

wherein $Ar^1$ represents a tetravalent aromatic hydrocarbon group; $Ar^2$ represents a divalent aromatic hydrocarbon group having at least one acyloxy group at the ortho-position and/or the meta-position of the aromatic ring thereof; $Ar^3$ represents a divalent aromatic hydrocarbon group; and the subunit having an amount ratio of m in the repeating unit is present in an amount of at least 20% by weight based on the polyimide.

DETAILED DESCRIPTION OF THE INVENTION

In formula (I), $Ar^1$ is a tetravalent aromatic hydrocarbon group. Examples thereof include a benzene ring; a condensed polycyclic aromatic group, e.g., a naphthalene ring and an anthracene ring; and a group represented by formula (II):

wherein Ph represents a benzene ring (hereinafter the same); p represents 0 or 1; and X represents a divalent group, preferably $-CH_2-$, $-C(CH_3)_2-$, $-CO-$, $-S-$, $-SO_2-$, $-O-$, $-O-Ph-S-Ph-O-$, $-C(CF_3)_2-$, $-O-Ph-SO_2-Ph-O-$ or $-O-Ph-C(CF_3)_2-Ph-O-$, and more preferably $-C(CF_3)_2-$.

$Ar^2$ is a divalent aromatic hydrocarbon group having at least one acyloxy group at the ortho- and/or meta-positions of the aromatic ring thereof. Preferred examples of $Ar^2$ include $-Ph(OR^1)-Ph(OR^2)-$ and $-Ph(OR^1)-C(CF_3)_2-Ph(OR^2)-$, wherein $R^1$ and $R^2$ each represents a hydrogen atom or an acyl group of formula $R^3CO-$ or $R^4Si-$, wherein $R^3$ represents $CH_3-$, $CH_3C(CH_3)_2-$, $CH_3C(CH_3)_2-O-$, $CH_3CH(CH_3)-$ or $CF_3C(CF_3)_2-$ and $R^4$ represents $(CH_3)_3\equiv$ or $(CH_3)_2(C_2H_5)\equiv$, provided that at least one of $R^1$ and $R^2$ represents the acyl group. Most preferred group for $Ar^2$ is a tert-butoxy group or a trimethylsilyl group.

$Ar^3$ is a divalent aromatic hydrocarbon group. Examples of aromatic diamines providing $Ar^3$ include diaminodiphenyl ethers, e.g., 4,4'-diaminodiphenyl ether, 3,3'-dimethyl-4,4'-diaminodiphenyl ether, 3,3'-dimethoxy-4,4'-diaminodiphenyl ether, 3,3'-diaminodiphenyl ether and 3,4'-diaminodiphenyl ether; diaminodiphenyl thioethers, e.g., 4,4'-diaminodiphenyl thioether, 3,3'-dimethyl-4,4'-diaminodiphenyl thioether, 3,3'-dimethoxy-4,4'-diaminodiphenyl thioether and 3,3'-diaminodiphenyl thioether; diaminobenzophenone compounds, e.g., 4,4'-diaminobenzophenone, 3,3'-dimethyl-4,4'-diaminobenzophenone and 3,3'-diaminobenzophenone; diaminodiphenylmethanes, e.g., 3,3'-diaminodiphenylmethane, 4,4'-diaminodiphenylmethane and 3,3'-dimethyl-4,4'-diaminodiphenylmethane; diaminodiphenylpropanes, e.g., 2,2'-bis(4-aminophenyl)propane and 2,2'-bis(3-aminophenyl)propane; diaminodiphenyl sulfoxide compounds, e.g., 4,4'-diaminodiphenyl sulfoxide and 3,3'-diaminodiphenyl sulfoxide; diaminediphenylsulfones, e.g., 4,4'- diaminodiphenylsulfone and 3,3'-diaminodiphenylsulfone; diaminobiphenyls, e.g., benzidine, 3,3'-dimethylbenzidine, 3,3'-dimethoxybenzidine and 3,3'-diaminobiphenyl; diaminopyridines, e.g., 2,6-diaminopyridine, 2,5-diaminopyridine and 3,4-diaminopyridine; phenylenediamines, e.g., o-, m- or p-diaminobenzene; and other diamines such as 4,4'-di(p-aminophenoxy)diphenylpropane, 4,4'-di(m-aminophenylsulfonyl)diphenyl ether, 4,4'-di(p-aminophenylsulfonyl)diphenyl ether, 4,4'-di(m-aminophenyl thioether)diphenyl sulfide, 4,4'-di(p-aminophenyl thioether)diphenyl sulfide, 4,4'-di(m-aminophenoxy)diphenyl ketone, 4,4'-di(p-aminophenoxy)diphenyl ketone, 4,4'-di(m-aminophenoxy)diphenylmethane, 4,4'-di(p-aminophenoxy)diphenylmethane, 2,5-diaminotoluene, 2,4-diaminoxylene, diaminodurene, 1,5-diaminonaphthalene and 2,6-diaminonaphthalene.

The positively photosensitive polyimide composition of the present invention comprises polyimide having a repeating unit of formula (I), and the subunit having an amount ratio of m (i.e., the subunit having $Ar^2$) is present in an amount of at least 20% by weight, preferably at least 60% by weight, based on the polyimide. If the content of the subunit having an amount ratio of m is less than 20% by weight, the polyimide has reduced photosensitivity, making it difficult to obtain a relief image of high resolving power.

Other subunits than that having an amount ratio of m or n may be introduced in an amount of less than 5% by weight. Examples of such other subunits include a silyl-containing amine which is introduced to improve the adhesiveness.

The positively photosensitive polyimide composition of the invention can be prepared, for example, as follows.

An aromatic tetracarboxylic acid dianhydride having a structure corresponding to $Ar^1$ in the molecule thereof and an aromatic diamine having a hydroxyl group or a mixture of the hydroxyl-containing diamine and other aromatic diamine(s) are reacted in an organic solvent in approximately equimolar amounts to form a polyimide precursor. Examples of the organic solvent include N-methyl-2-pyrrolidone, dimethylacetamide, dimethylformamide, dimethyl sulfoxide, hexamethylenephosphoric triamide, pyridine, cresol, phenol and xylenol. If desired, these solvents may be used in combination with other general-purpose solvents, such as hexane, benzene, toluene and alcohols.

To the resulting polyimide precursor are added an acid anhydride for acylation and pyridine, so as to conduct acylation of the hydroxyl group (introduction of an acyloxy group) and imide conversion thereby obtaining polyimide of formula (I).

Alternatively, polyimide of formula (I) can also be prepared by reacting an aromatic diamine component having previously introduced thereinto an acyloxy group with an aromatic tetracarboxylic acid dianhydride.

Further, polyimide of formula (I) can be prepared by that polyimide is obtained by thermal ring closure of a polyimide precursor solution, and an anyloxy group is introduced thereinto by acylation in the presence of a basic catalyst such a triethylamine.

Because the polymer skeleton of the photosensitive polyimide used in the photosensitive composition of the present invention is designed to have the above-described specific structure, the polyimide exhibits extremely satisfactory solubility in organic solvents. For example, it is soluble in general-purpose organic solvents, e.g., γ-butyrolactone, diglyme, triglyme, cyclohexanone, dioxane, methyl cellosolve, ethyl cellosolve and chloroform.

The positively photosensitive polyimide composition according to the present invention containing the above-described photosensitive polyimide is generally applied to use as an admixture with a photodecomposable proton generator. Conventional photodecomposable proton generators can be used, and examples thereof include diarylsulfonium salts ($Ar'_2I^+Y^-$), triarylsulfonium salts ($Ar'_3S^+Y^-$), dialkylphenacylsulfonium salts, aryldiazonium salts ($Ar'N_2^+Y^-$) (wherein $Ar'$ represents an aryl group and Y represents a group capable of being converted to a lewis acid after dissociation), aromatic tetracarboxylic acid esters, aromatic sulfonic acid esters, nitrobenzyl esters, and aromatic sulfamides. These substances may be used either individually or in combination of two or more thereof.

The proton generator is generally used in an amount of from 1% to 50% by weight, and preferably from 5% to 15% by weight, based on the amount of the polyimide. If the amount is too small, the rate of acid hydrolysis tends to become slow to reduce sensitivity. If it is too large, stability of the photosensitive composition tends to be deteriorated.

An illustrative example of image formation by the use of the positively photosensitive polyimide composition according to the present invention is hereinafter described.

A photodecomposable proton generator is added to the polyimide, and the mixture is dissolved in the above-described general-purpose organic solvents to prepare a photosensitive solution. The photosensitive solution is coated on a support and dried preferably to a dry thickness of from 1 to 30 μm, more preferably from 3 to 10 μm. The thus formed coating film is exposed to light through a photomask. Examples of the light source include a high voltage mercury lamp and super-high voltage mercury lamp. The exposure amount is preferably from 50 mJ to 1 J.

After exposure, the film is subjected to development for removing the exposed area by a soaking or spraying method. A developer which can be used for development is preferably capable of completely dissolving the exposed film within an appropriate period of time. Examples of the developer include an aqueous solution of an inorganic alkali, e.g., sodium hydroxide and potassium hydroxide, and an organic diamine compound, e.g., propylamine, butylamine, monoethanolamine, trimethylammonium hydride, ethylenediamine and trimethylenediamine. The developer may be used either individually or in combination of two or more thereof. If desired, these amine compounds may be mixed with a poor solvent for polyimide, e.g., methanol, ethanol, propanol, ethylene glycol, ethyl cellosolve, butyl cellosolve, diethylene glycol, ethylcarbitol, butylcarbitol, and water.

Development is followed by washing with a rinsing solution to obtain a desired polyimide pattern or image. Examples of the rinsing solution include one or more of methanol, ethanol, water, isoamyl acetate, etc.

It is possible to form a negative pattern if an organic solvent, e.g., chloroform and methylene chloride, is used as a developer.

The positively photosensitive polyimide composition of the present invention contains specific polyimide having an acyloxy group in the main chain thereof for improving solubility in organic solvents. The acyloxy group in the polyamide is hydrolyzed on exposure to light to induce change in alkali solubility. The present invention thus makes it possible to reproduce a fine pattern which could not achieved with the conventional positively photosensitive polyimide composi- Each of the resulting polyimide resins had an inherent viscosity falling within a range of from 0.2 to 0.9 as measured at 25° C. in N-methyl-2-pyrrolidone.

In Comparative Example 2, the polyimide precursor was heated up to 190° C. while stirring to obtain a polyimide solution.

TABLE 1

| Example No. | $Ar^1$ | $Ar^2$ | $Ar^3$ |
|---|---|---|---|
| Example 1 | ![CF3-C(CF3)- bridged diphenyl] | $R^1O$-[CF3-C(CF3)- bridged diphenyl]-$OR^2$ | — |
| Example 2 | " | " | — |
| Example 3 | " | " | [diphenyl ether-C(CF3)2-phenyl ether structure] |
| Example 4 | " | " | — |
| Example 5 | " | " | — |
| Comparative Example 1 | " | " | [diphenyl ether-C(CF3)2-phenyl ether structure] |
| Comparative Example 2 | " | " | — |

| Example No. | $R^1$ | $R^2$ | m/n |
|---|---|---|---|
| Example 1 | $CH_3-CO-$ | $CH_3-CO-$ | 100/0 |
| Example 2 | $CH(CH_3)_2-CO-$ | $CH(CH_3)_2-CO-$ | 100/0 |
| Example 3 | " | " | 80/20 |
| Example 4 | $(CH_3)_3Si-$ | $(CH_3)_3Si-$ | 100/0 |
| Example 5 | $(CH_3)_3C-O-CO-$ | $(CH_3)_3C-O-CO-$ | 100/0 |
| Comparative Example 1 | " | " | 10/90 |
| Comparative Example 2 | $H-$ | $H-$ | 100/0 | tions.

Further, since the polyimide is soluble in solvents, there is no need to conduct a high temperature heat treatment for imide conversion, thus producing a relief image excellent in dimensional stability with reduced volumetric shrinkage.

Accordingly, the polyimide composition of the present invention is suitably applied as a photoresist or a heat resistant material for formation of a protective film, an insulating film or a passivation layer for solid elements in the semiconductor industry.

The present invention is now illustrated in greater detail with reference to Examples, but it should be understood that the present invention is not construed as being limited thereto. In Examples, all the parts and percents are by weight unless otherwise specified.

EXAMPLES 1 TO 5 AND COMPARATIVE EXAMPLES 1 TO 2

An aromatic tetracarboxylic acid dianhydride and an aromatic diamine in which $Ar^1$, $Ar^2$, $Ar^3$, $R^1$, $R^2$ and the amount ratio of the subunits m/n by weight were as defined in Table 1 below were reacted at an approximately equal molar ratio in N-methyl-2-pyrrolidone at 25° C. to prepare a polyimide precursor solution.

An acid anhydride having a structure of $R^1-O-R^1$ or $R^2-O-R^2$ and pyridine were added to the solution while being kept at 0° C. to conduct a reaction at room temperature for 2 hours. The reaction mixture was poured into a poor solvent to recover polyimide having a corresponding acyloxy group.

TEST EXAMPLE 1

The polyimide obtained in Example 1 was dissolved in cyclohexanone to prepare a photosensitive solution having a concentration of 30% by weight. To the solution was added p-nitrobenzyl-9,10-dimethoxyanthracene-2-sulfonate as a photodecomposable proton generator in an amount of 10% by weight based on the amount of the polyimide.

The resulting solution was spin-coated on a silicone wafer to form a film having a dry thickness of 3 μm. The film was subjected to contact exposure in vacuo to light emitted from a super-high-pressure mercury lamp (250 W) placed 30 cm away from the film for 3 minutes through a quartz mask.

The exposed film was developed by soaking in a 1% to 5% aqueous solution of tetramethylammonium hydroxide for 90 seconds and then rinsed by immersion in water or an aqueous solution containing small amount of acetic acid for 20 seconds to obtain a relief image.

Observation of the relief image under an electron microscope revealed resolving power of a 3 μm wide line having an aspect ratio of 1.0. When the relief image was heat treated at 350° C. for 30 minutes, the volume change on heat shrinkage was 17%.

TEST EXAMPLES 2 AND 3

A relief image was obtained in the same manner as in Test Example 1, except for using the polyimide prepared in Examples 2 or 3, changing the exposure time to 3 minutes or 10 minutes, respectively, changing the development time to 2 minutes, and changing the rinsing time to 30 seconds.

The resulting relief image formed from the polyimide of Example 2 or 3 revealed resolving power of up to 4 μm or 5 μm, respectively. The volume change on heat shrinkage was 20% or 12%, respectively.

TEST EXAMPLES 4 AND 5

A relief image was obtained in the same manner as in Test Example 1, except for using the polyimide prepared in Examples 4 or 5.

The resulting relief image formed from the polyimide of Example 4 or 5 revealed resolving power of a 3 μm wide line having an aspect ratio of 2.0. The volume change on heat shrinkage each was 20%.

TEST EXAMPLES 6 AND 7

A relief image was obtained in the same manner as in Test Example 1, except for using the polyimide prepared in Comparative Example 1 or 2.

In the case of using the polyimide of Comparative Example 1, the exposure time was extended to 30 minutes and the development time was also extended to 60 minutes or even longer because of the small content of the acyloxy group. However, the relief pattern was etched during the prolonged immersion in the developer, resulting in a failure of forming a satisfactory relief image.

In the case of using the polyimide of Comparative Example 2, extension of the exposure time to 60 minutes or even longer only resulted in swelling of the polyimide during development, failing to obtain a relief image.

As described in the foregoing, the positively photosensitive polyimide composition of the present invention exhibits high photosensitivity and high resolution power in image formation even of a fine pattern and has dimensional precision.

While the invention has been described in detail and with reference to specific embodiments thereof, it will be apparent to one skilled in the art that various changes and modifications can be made therein without departing from the spirit and scope thereof.

What is claimed is:

1. A positively photosensitive polyimide composition comprising polyimide having a repeating unit represented by formula (I):

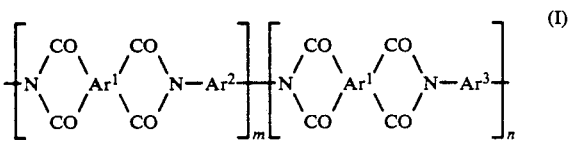

wherein $Ar^1$ represents a tetravalent aromatic hydrocarbon group; $Ar^2$ represents a divalent aromatic hydrocarbon group having at least one acyloxy or silyloxy group at the ortho-position and/or the meta-position of the aromatic ring of said aromatic hydrocarbon group; $Ar^3$ represents a divalent aromatic hydrocarbon group; and the subunit having an amount ratio of m in said repeating unit is present in an amount of at least 20% by weight based on the polyimide, wherein said composition further comprises a photodecomposable proton generator in an amount of from 1% to 50% by weight based on the amount of said polyimide.

2. A positively photosensitive polyimide composition as claimed in claim 1, wherein $Ar^2$ represents —Ph(OR$^1$)—Ph(OR$^2$)— or —Ph(OR$^1$)—C(CF$_3$)$_2$—Ph(OR$^2$)—, wherein $R^1$ and $R^2$ each represents a hydrogen atom, an acyl group of formula $R^3CO$— or a group of formula $R^4Si$—, wherein $R^3$ represents $CH_3$—, $CH_3C(CH_3)_2$—, $CH_3C(CH_3)_2$—O—, $CH_3CH(CH_3)$—[$CH_3CH(CH_3)_2$—] or $CF_3C(CF_3)_2$— and [$R^4$] $R^4Si$— represents $(CH_3)_3Si$— or $(CH_3)_2(C_2H_5)Si$— [$(CH_3)_3$— or $(CH_3)_2(C_2H_5)$—], provided that at least one of $R^1$ and $R^2$ represents said acyl or silyl group.

3. A positively photosensitive polyimide composition as claimed in claim 2, wherein $Ar^2$ represents a tert-butoxy group or a trimethylsilyl group.

* * * * *